United States Patent
Hui et al.

(10) Patent No.: US 7,525,356 B2
(45) Date of Patent: Apr. 28, 2009

(54) LOW-POWER, PROGRAMMABLE MULTI-STAGE DELAY CELL

(75) Inventors: Keven Hui, San Ramon, CA (US); Ting Fang, Pleasanton, CA (US); Hui Yin Seto, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 185 days.

(21) Appl. No.: 11/531,829

(22) Filed: Sep. 14, 2006

(65) Prior Publication Data

US 2008/0068060 A1    Mar. 20, 2008

(51) Int. Cl.
*H03L 7/00*    (2006.01)
(52) U.S. Cl. .................. 327/161; 327/270; 327/276
(58) Field of Classification Search .......... None
See application file for complete search history.

(56) References Cited

U.S. PATENT DOCUMENTS

| | | | | |
|---|---|---|---|---|
| 5,355,037 | A * | 10/1994 | Andresen et al. | 327/158 |
| 6,906,569 | B2 * | 6/2005 | Brox | 327/276 |
| 7,205,803 | B2 * | 4/2007 | Chung et al. | 327/158 |
| 2006/0132210 | A1 * | 6/2006 | Kong et al. | 327/261 |

* cited by examiner

*Primary Examiner*—Cassandra Cox
(74) *Attorney, Agent, or Firm*—North Weber & Baugh LLP

(57) ABSTRACT

A system, apparatus and method for delaying a signal, such as a high-speed signal are disclosed. A multi-stage delay cell is described in which the amount of delay applied to a signal depends on which stages are activated within the cell. In various embodiments of the invention, noise caused by transitions between various delay times within the cell is reduced by efficiently managing voltage states on each of the stages.

18 Claims, 3 Drawing Sheets

LOW-POWER, PROGRAMMABLE MULTI-STAGE DELAY CELL

BACKGROUND

A. Technical Field

The present invention relates generally to signal synchronization, and more particularly, to the design of low-power delay cells.

B. Background of the Invention

The importance and application of electronic technology to day-to-day life is well known. The increasing accuracy of signal processing circuits has allowed ever-increasing amounts of data to be transmitted and received across a communication path in a reliable manner.

Circuits that process these high-speed signals are generally required to be in synchronization with various other signals or clock signals. The signals fed to these high-speed circuits may be "source-synchronized" by timing their relationship with an external clock signal(s). Using this clock, these high-speed circuits provide synchronized sampling of high-speed data signals for further signal processing applications.

Delay cells are an example of devices that may be used to adjust a clock-data phase relationship to an optimal setting to achieve the highest timing margin. The delay cell is typically designed with an array of delay elements arranged such that any number of elements can be chosen to apply a particular delay. However, due to the nature of the cell architectures, glitches can occur when the input or delay settings are changed.

FIG. 1 illustrates an exemplary signal processing scenario in which source synchronization is used to sample a data signal. As shown, a source-synchronized application 101 may be a high-speed circuit accepting a data signal 112 and a clock signal 114. The data signal 112 may be a high-speed signal. An interface 122 at the input of the source-synchronized application 101 is generally used to affect the synchronization between the data signal 112 and the clock signal 114. The interface may provide the source-synchronized signal for further processing in a signal-processing module 124. Output data 126 from the signal-processing module 124 may be made available on output.

In providing the synchronization of the data signal 112 and the clock signal 114, the interface 122 may use delay cells. In one example of a delay cell, a delay cell may be used to introduce variable delay to one of input signals in order to synchronize them with respect to the other. This variation in the delay may be required to be introduced during working of the circuit and the change in the delay may be required to be introduced quickly within the cells or "on the fly."

If the logical level of the delay is quickly changed, the response of voltage or current characteristics of the delay cells may lag. A "glitch" in the form of spikes or irregularity in the original signal may be introduced and thus initiate a corresponding undesired response in the circuit. For example, in a clock signal having an off-time duration of 5 ns, a glitch may be introduced at 3 ns leading to initiation of a corresponding faulty response.

"Signal fighting" within the cell may also introduce glitches. The phenomena of "signal fighting" may occur when a component receives signal from two or more branches. The signal at individual branches may effectively try to overrun one another leading to a temporary unstable state. For example, when one delay cell branch is providing a low level signal while another branch is providing a high level signal, then for a certain period the high level signal will overrun the low level signal leading to a glitch in the resultant signal.

Power consumption may also be an important factor in the design and performance of a delay cell. Because delay cells are typically integrated within a chip, power considerations need to be addressed in order to optimize the power requirements of the chip. In addition, improper power management within the delay cell may introduce noise on a signal and may significantly affect the signal-to-noise ratio.

SUMMARY OF THE INVENTION

A system, apparatus and method for delaying a signal, such as high-speed signal are disclosed. A multi-stage delay cell is described in which the amount of delay applied to a signal depends on which stages are activated within the cell. In various embodiments of the invention, glitches caused by transitions between various delay stages within the cell are reduced by efficiently managing voltage states on each of the stages. This voltage state management within the delay cell provides a relatively smooth voltage transition as stages are activated or deactivated.

In one embodiment of the invention, the multi-stage delay cell comprises cascaded delay stages that are used for providing variable delay on a signal. The number of delay stages forming a delay cell may be decided based on the range of delay required.

The amount of delay across the multi-stage delay cell may be adjusted by activating or deactivating certain stages therein. Because of the internal design of the delay cell, the voltage response to changes in the delay period is significantly improved. In particular, the multi-stage delay cell provides state management that allows for a more efficient transition between voltage states between the different stages within the cell as a result of a voltage state on a delay stage being set prior to transitioning to the delay stage.

In one embodiment of the invention, an input signal may be delayed for a certain time period in order for proper synchronization with another signal, such as a clock. The transition of the delay introduced may be defined by the activation or deactivation of select lines used to control various stages within the cell. The transition of delay from a delay setting to another may be affected by providing programmable control lines. These control lines may provide a sequence of bit values; each of the select lines being assigned to cause a desired control setting. In order to increase the delay value, the number of delay stages introduced in the delay path of the signal being input may be increased. The amount of delay is aggregated to cause an increase in the delay of the signal being input to the system.

During the operation of the multi-stage delay cell, only components/stages are activated that are associated with the signal path through the delay cell and those related to controlling voltage state(s) on a delay stage(s). This power scheme reduces the amount of power consumed by the delay cell during operation and reduces internal noise.

Other objects, features and advantages of the invention will be apparent from the drawings, and from the detailed description that follows below.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

FIG. 1 illustrates a general prior art system incorporating source synchronized signals.

DETAILED DESCRIPTION OF THE PREFERRED EMBODIMENTS

A system, apparatus and method for delaying a signal, such as a high-speed signal are disclosed. A multi-stage delay cell is described in which the amount of delay applied to a signal depends on which stages are activated within the cell. In various embodiments of the invention, noise caused by transitions between various delay times within the cell is reduced by efficiently managing voltage states on each of the stages.

In the following description, for purpose of explanation, specific details are set forth in order to provide an understanding of the invention. It will be apparent, however, to one skilled in the art that the invention may be practiced without these details. One skilled in the art will recognize that embodiments of the present invention, some of which are described below, may be incorporated into a number of electronic circuits such as high-speed circuits. Structures and devices shown below in block diagram are illustrative of exemplary embodiments of the invention and are meant to avoid obscuring the invention. Furthermore, connections between components within the figures are not intended to be limited to direct connections. Rather, data between these components may be modified, re-formatted or otherwise changed by intermediary components.

Reference in the specification to "one embodiment" or "an embodiment" means that a particular feature, structure, characteristic, or function described in connection with the embodiment is included in at least one embodiment of the invention. The appearances of the phrase "in one embodiment" in various places in the specification are not necessarily all referring to the same embodiment.

A. Overview

Figure 1:
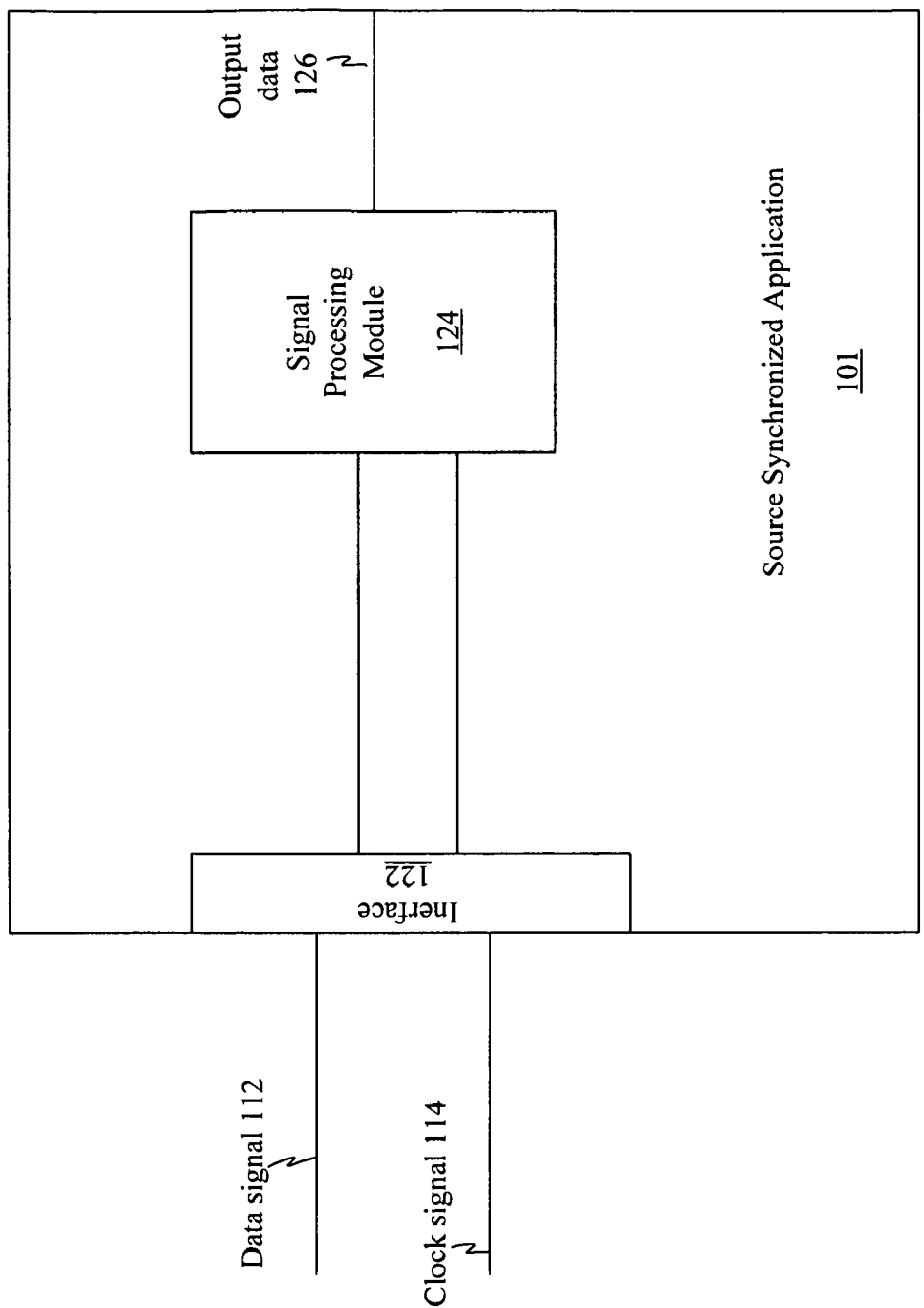
Figure 2:
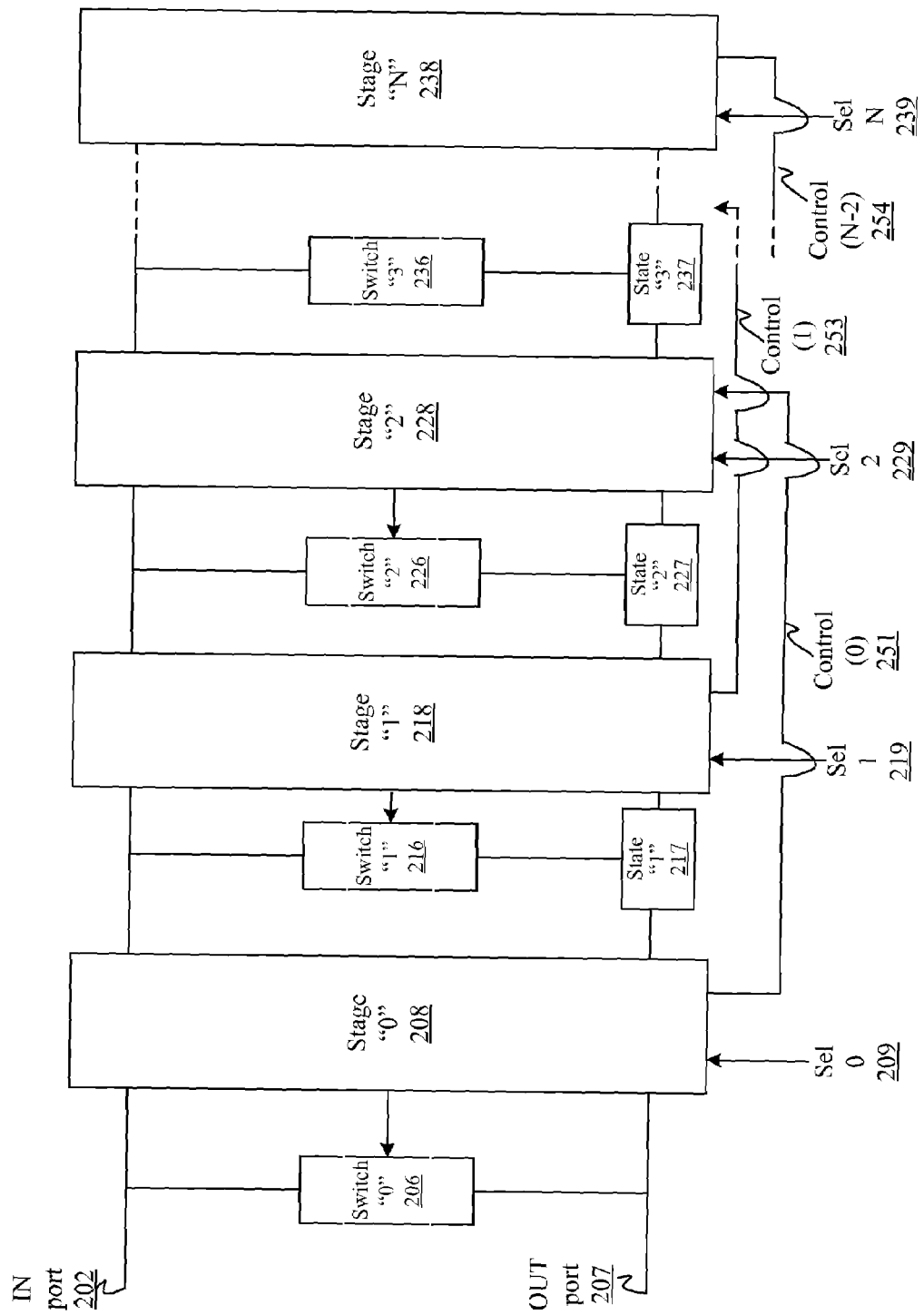
FIG. 2 is a general diagram illustrating a system for delaying a signal according to various embodiments of the invention.

FIG. 2 is a schematic representation of a multi-stage delay cell for delaying a signal according to various embodiments of the present invention. The delay cell may be provided in an interface accepting signals, such as a source clock signal, which need to be synchronized for further processing. For example, the delay cell may be used to synchronize a data signal and clock signal so that the sampling may be performed. It is important to note that the multi-stage delay cell may delay any type of signal including clock signals, data signals, etc.

The delay cell receives an input signal at an IN port 202 and subsequently causes a delay on the signal by activating one or more delay stages 208, 218, 228, 238 within the cell. The amount of delay introduced to the input signal at IN port 202 may be decided by activation or deactivation of select lines (Sel 0, Sel 1, Sel 2, Sel N) 209-239, each of which are associated with one of the delay stages. As shown in the Figure, the number of delay stages within the cell may vary. A maximum delay that may be applied by the cell is defined according to the total number of delay stages in the cell.

Each stage within the delay cell may be activated or deactivated by a corresponding select line. Each delay stage is also provided an associated switch that is used to electrically couple or decouple the particular stage within an activated, cascaded delay stage group. Upon activation, a switch may electrically couple its corresponding delay stage in parallel to a previous delay stage and introduce a voltage state at its output. For example, state "1" 217 corresponds to a voltage state at the output of switch "1" 216, state "2" 227 corresponds to a voltage state at the output of switch "2" 226, state "3" 237 corresponds to a voltage state at the output of switch "3" 236. By defining and controlling the voltage level on each of these states, a smooth transition may be provided as delay stages are activated and deactivated.

Control signals such as control (0) 251, control (1) 253, control (N-2) 254, may be provided for signaling stages. For example, the control signal control (N-2) 254 is used to signal the delay stage "N" 238.

During the operation of the delay cell, an input signal is received at IN port 202. If select lines "Sel 0" 209, "Sel 1" 219, "Sel 2" 229, and "Sel N" 239 are inactive, then the input signal at IN port 202 passes through switch "0" 206 whereby the signal is delayed by the cell's minimal amount of delay and transmitted on the OUT port 207. While the select lines "Sel 0" 209, "Sel 1" 219, "Sel 2" 229, and "Sel N" 239 are inactive, the switch "1" 216 is active resulting in a known voltage state at a node state "1" 217.

The delay applied to the signal may be increased by activating select line "Sel 0" 209, which causes the path of the signal to change. The new signal path includes being communicated through delay stage "0" 208 and switch "1" 216 prior to being transmitted on the OUT port 207. This new path causes additional delay on the signal by a time attributed to the delay stage "0" 208. This transition to additional delay is smooth because of the pre-existing voltage level at state "1" 217. In particular, the pre-existing voltage reduces the amount of voltage build required to activate delay stage "0" 208, which improves the response of the cell and minimizes potential glitches caused by this transition.

Activation of select line "Sel 0" 209 also results in control (0) 251 to signal delay stage "2" 228 to activate the switch "2" 226. As a result, state "2" is brought to a known state which allows for a smooth transition if delay stage "1" should be activated by "Sel 1" 219, thereby reducing the chances of glitch occurring in this transition.

In addition to reducing noise, such as glitches, caused by activating and deactivating delay stages, the present invention provides efficient power management in transitioning between delay stages. In particular, because the activation of a select line applies voltage at both an active switch and an output of a switch that will be activated in the future, the overall switching power consumption is minimized during these transition periods.

One skilled in the art will recognize that the above-described functional block diagram may be realized using numerous different circuit designs and architectures. For illustrative purposes, one such design is provided below.

B. Delay Stages Activation

Figure 3:
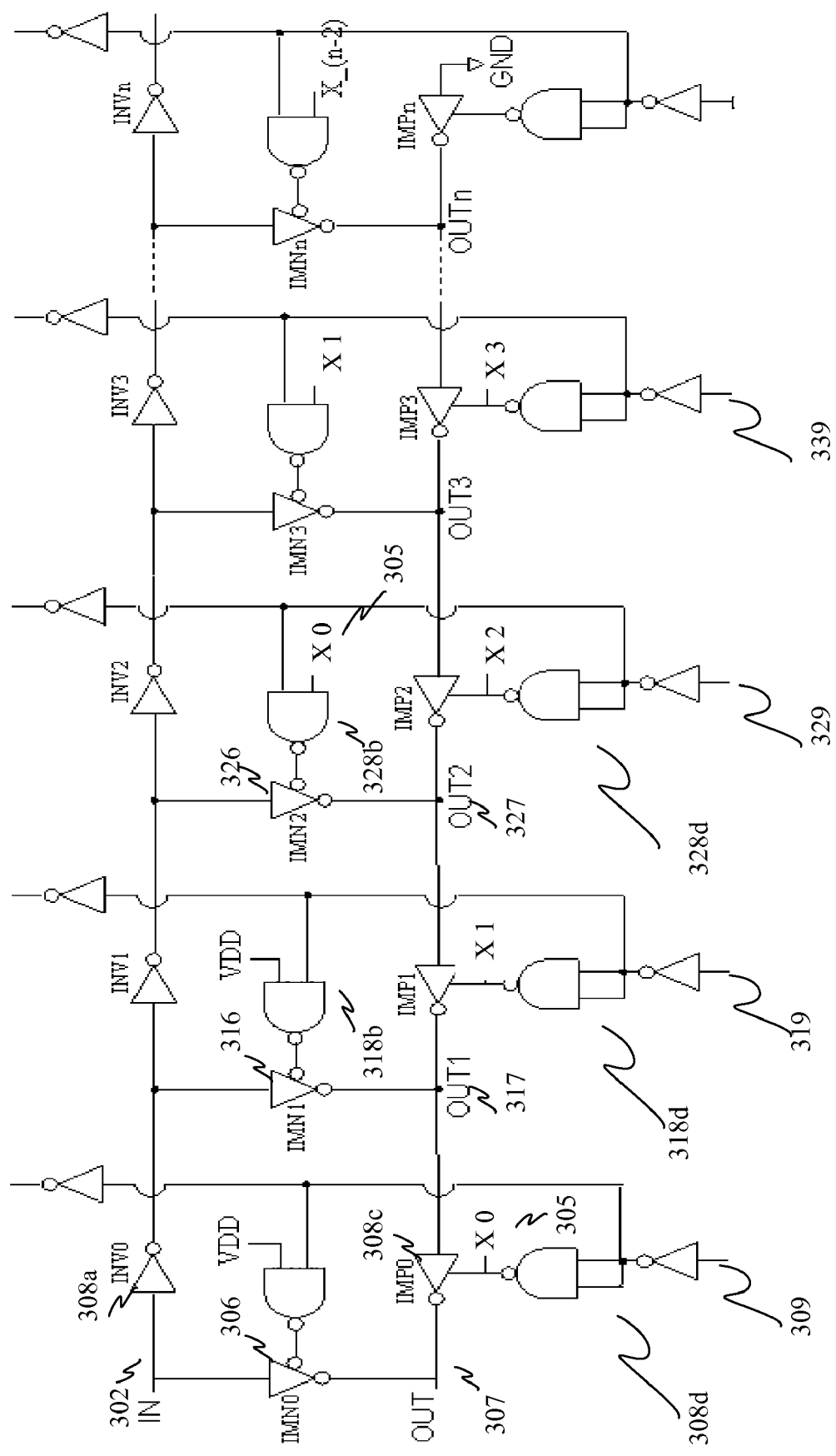
FIG. 3 illustrates a circuit level implementation of a system for delaying a signal according to various embodiments of the invention.

FIG. 3 illustrates a circuit level implementation of a multi-stage delay cell according to various embodiments of the invention. In this particular implementation, the delay cell is formed by N cascaded delay stages in series. Each stage of the delay cell may be designed to comprise various components including combinational logic, logic gates or switches. For example, a delay stage as illustrated in FIG. 3, may comprise an inverter and two tri-stage inverters, one having an active high enable and the other having an active low enable.

In various embodiments of the invention, each stage of the system comprises delay components such as switches, which may be implemented as inverting switches. In order to provide variable delay, each stage is assigned a select line, which may be activated or deactivated as per a delay setting. Select lines ("Sel 0" 309, "Sel 1" 319, "Sel 2" 329, "Sel 3" 339) may be used for activating or deactivating corresponding delay stages. Combinational logic (308*d,* 318*d,* 328*d*) at each delay stage is used to interface with the appropriate select lines.

The delay settings may define bits assigned to each select line of the cell, each setting having an associated amount of delay and delay stage activation configuration. For example, causing each of the select lines to be inactive results in a delay setting corresponding to a minimum delay of the cell. During a first delay setting (hereafter "first delay setting"), an input signal at the IN port 302 passes through the inverter IMN0 306. Since the input signal passes through a single component (i.e., the inverting switch IMN0 306) an "intrinsic delay" is introduced in the first delay setting which represents the minimal delay across the delay cell. A person skilled in the art will recognize that the intrinsic delay may correspond to the delay within the inverter switch and defines a delay floor from which subsequent delay may be added.

During the operation of the delay cell in a first delay setting, inverter INV0 308*a* and an inverting switch 316 may be activated resulting in a known state being present at OUT1 317. Combinational logic 318*b* is used to control the switching of the inverting switch 316. Because the inverting switch IMP0 308*c* is inactive, the signal at node OUT1 317 does not pass through the inverting switch IMP0 308*c* and does not affect the signal at the OUT port 307. Thus, in this scenario, the input signal received at IN port 302 passes through inverting switch IMN0 306 (resulting in the application of an intrinsic delay) to the OUT port 307 and a known voltage state is set at OUT1 317.

As previously discussed, a change in the delay settings, and corresponding bits at the select lines, may be used to increase delay across the cell. For example, the select line "Sel 0" 309 may be provided a bit value of 1, which may correspond to the activation of a second delay setting. Upon activation of "Sel 0" 309, the control signal X0 305 at the output of the combinational logic 308*d* activates the associated inverting switch IMP0 308*c* resulting in electrically coupling additional delay within the signal path. The control signal X0 305 also signals the logic gate 328*b* to activate the inverting switch IMN2 326. Thus, the node OUT2 327 is brought to a known state.

During the operation of the delay cell in the second delay setting, the path followed by the input signal involves the inverter INV0 308*a,* and the inverting switches IMN1 316 and IMP0 308*c.* Thus, the overall delay introduced on the input signal is the aggregate of the delay introduced by these individual elements in the signal path. The operation of subsequent delay stages is apparent to one skilled in the art in view of FIG. 3.

C. Delay Transition

The transition of the delay settings by changing the delay may be programmed. A set of programmable control lines may control the activation or deactivation of the select lines and thus determine the delay across the cell. In various embodiments of the invention, the control line settings may be programmed to shift from a delay setting to another following a predefined sequence of transitions in a cascading manner. For example, the transition of the delay setting from a first delay setting to a third delay setting may inherently include a second delay stage.

The sequence of bits assigned to select lines ("Sel 0" 309, "Sel 1" 319, "Sel 2" 329) respectively in first delay setting may be "0,0,0". The select line "Sel 0" 309 is activated resulting in the second delay setting having the bit sequence of "1,0,0", while in third delay setting the sequence shifts to "1,1,0" by changing the value at the select line "Sel 1" 319 to "1".

The transition of the delay setting in a predefined sequence may ensure smooth increase in the delay applied to the signal (i.e., only one bit value is changed in the bit sequence of the select lines). During the transition of the delay setting, only limited components are switched depending on their relationship to known voltage states within the cell. This ensures both smooth delay transitions and minimum power switching.

During the operation of the delay cell in the first delay setting, the inverting switch IMN1 316 may be active causing the node OUT1 317 to be at a known state. For example, if the signal at the IN port 302 is "1", then voltage value at node OUT1 317 corresponds to the "1". During the change of the delay setting from the first delay setting to a second delay setting, the inverting switch 308*c* is activated thereby allowing the input signal to be communicated through the inverter INV0 308*a,* and inverting switches IMN1 316 and IMP0 308*c*. Since the node OUT1 317 was already at value "1" (i.e., a known state), any glitches that might occur during the transition are minimized.

The delay cell design also activates components and/or delay stages that are necessary to implement the desired delay. For example, during the operation of the cell in the second delay setting, the inverter INV0 308*a,* and inverting switches IMN1 316, IMP0 308*c* and IMN2 326 are active while the rest of the tri-state inverters are disabled. This efficient use of components within the cell further reduces noise within the cell itself.

The foregoing description of the invention has been described for purposes of clarity and understanding. It is not intended to limit the invention to the precise form disclosed. Various modifications may be possible within the scope and equivalence of the appended claims.

We claim:

1. A multi-stage delay cell comprising:
    a delay cell input coupled to receive an electrical signal;
    a first switch, coupled to the delay cell input and a delay cell output, that switches the electrical signal on a first path having an associated first delay;
    a second switch, coupled in parallel to the first switch, that switches the electrical signal on a second path having an associated second delay and wherein the second path comprises a first delay stage;
    a first control line, coupled to the first delay stage, that electrically couples the second path between the delay cell input and the delay cell output, and electrically decouples the first data path between the delay cell input and the delay cell output; and
    wherein a first voltage state is set on the output of the second switch prior to electrically coupling the second path between the delay cell input and the delay cell output and a second voltage state is set on an output of a third switch.

2. The multi-stage delay cell of claim 1 wherein the first voltage state removes glitches caused by a transition from the first path to the second path within the delay cell.

3. The multi-stage delay cell of claim 1 wherein the first switch comprises a tri-state inverter.

4. The multi-stage delay cell of claim 1 wherein the second path comprises a first tri-state inverter, a second tri-state inverter and a first inverter.

5. The multi-stage delay cell of claim 1 further comprising N number of delay stages are coupled in parallel within the delay cell and may be activated according to various activation configurations to vary a delay between the delay cell input and the delay cell output.

6. The multi-stage delay cell of claim 5 further comprising a plurality of select lines, coupled to the N number of delay stages, that control the various activation configurations in the delay cell.

7. The multi-stage delay cell of claim 6 wherein the plurality of select lines can vary the delay between the delay cell input and the delay cell output by changing the number of delay stages within a cascaded delay stage configuration.

8. The multi-stage delay cell of claim 6 further comprising a plurality control lines, coupled to the N number of delay stages, that set at least one voltage state on at least one delay stage within the N number of delay stages.

9. The multi-stage delay cell of claim 8 wherein a control line within the plurality of control lines is associated with the first delay stage and sets a voltage state on a second delay stage.

10. The multi-stage delay cell of claim 1 wherein a delay is applied to the electrical signal for synchronization purposes relative to a clock signal.

11. A delay stage that is operable within a variable delay cell, the delay stage comprising:
- an input of the delay cell coupled to receive an electrical signal;
- a first inverter, coupled to the input, that inverts the electrical signal;
- a first tri-state inverter, coupled to the input and the first inverter, that sets a first voltage state on the delay stage prior to the delay stage being activated;
- a second tri-state inverter, coupled to the first tri-state inverter and an output of the delay cell, that electrically activates and deactivates the delay stage; and
- digital logic, coupled to the second tri-state inverter and coupled to receive a select line signal, that controls the second tri-state inverter and a second voltage state associated with a second delay stage.

12. The delay stage of claim 11 wherein the digital logic comprises an inverting AND gate.

13. The delay stage of claim 11 wherein the delay stage is coupled in parallel with a plurality of other cascaded delay stages so that a variable delay may be realized.

14. The delay stage of claim 11 further comprising a control line, coupled to the output of the digital logic, that sets a voltage state on at least one of the other cascaded delay stages.

15. The delay stage of claim 11 wherein the electrical signal is a clock signal.

16. A method for providing a variable time delay to an electrical signal, the method comprising:
- receiving an electrical signal;
- defining a first signal path, having a first delay, for the electrical signal and wherein the first signal path is selected from a plurality of signal paths having a plurality of potential delays;
- setting a first voltage state, associated with a second signal path, in order to smooth a transition from the first signal path to the second signal path;
- transmitting the electrical signal on the first signal path so that the first delay is applied to the electrical signal;
- defining the second signal path for the electrical signal;
- deactivating the first signal path;
- switching the electrical signal from the first signal path to the second signal path after the first voltage state has been set; and
- setting a second voltage state, associated with a third signal path, in order to smooth a transition from the second signal path to the third signal path.

17. The method of claim 16 wherein the electrical signal is a data signal that is synchronized to a clock signal by applying the first delay.

18. The method of claim 16 further comprising the steps of:
- defining the third signal path for the electrical signal;
- deactivating the second signal path;
- switching the electrical signal from the second signal path to the third signal path after the second voltage state has been set; and
- setting a third voltage state, associated with a fourth signal path, in order to smooth a transition from the third signal path to the fourth signal path.

* * * * *